(12) United States Patent
Kim et al.

(10) Patent No.: US 8,883,531 B2
(45) Date of Patent: Nov. 11, 2014

(54) ORGANIC LIGHT EMITTING DIODE DISPLAY DEVICE AND METHOD OF MANUFACTURING THE SAME

(71) Applicant: LG Display Co., Ltd., Seoul (KR)

(72) Inventors: Se June Kim, Paju-si (KR); Joon Suk Lee, Seoul (KR); Yong Chul Kim, Paju-si (KR); Sung Bin Shim, Yangsan-Si (KR)

(73) Assignee: LG Display Co., Ltd., Seoul (KR)

( * ) Notice: Subject to any disclaimer, the term of this patent is extended or adjusted under 35 U.S.C. 154(b) by 107 days.

(21) Appl. No.: 13/692,676

(22) Filed: Dec. 3, 2012

(65) Prior Publication Data

US 2014/0061595 A1 Mar. 6, 2014

(30) Foreign Application Priority Data

Aug. 28, 2012 (KR) .................. 10-2012-0094094

(51) Int. Cl.
*H01L 21/00* (2006.01)
*H01L 27/32* (2006.01)
*H01L 51/56* (2006.01)

(52) U.S. Cl.
CPC ........... *H01L 27/3244* (2013.01); *H01L 51/56* (2013.01)
USPC ................... 438/35; 438/38; 257/91

(58) Field of Classification Search
CPC ................. H01L 27/32; H01L 27/3258
USPC .............. 438/38, 30, 34, 35; 257/91; 349/147
See application file for complete search history.

(56) References Cited

U.S. PATENT DOCUMENTS

| | | | |
|---|---|---|---|
| 2003/0058376 A1* | 3/2003 | Zhang | 349/43 |
| 2005/0225232 A1* | 10/2005 | Boroson et al. | 313/504 |
| 2005/0225253 A1* | 10/2005 | Yamada et al. | 315/169.3 |
| 2006/0214573 A1* | 9/2006 | Maeda et al. | 313/506 |
| 2008/0143939 A1* | 6/2008 | Adachi et al. | 349/114 |
| 2009/0051283 A1* | 2/2009 | Cok et al. | 313/506 |
| 2009/0225260 A1* | 9/2009 | Adachi et al. | 349/114 |
| 2010/0052524 A1* | 3/2010 | Kinoshita | 313/504 |
| 2010/0201932 A1* | 8/2010 | Gotoh et al. | 349/141 |
| 2011/0031876 A1* | 2/2011 | Park et al. | 313/504 |

* cited by examiner

Primary Examiner — Caridad Everhart
(74) *Attorney, Agent, or Firm* — Brinks Gilson & Lione

(57) ABSTRACT

An OLED display device is provided. The OLED display device includes a substrate segmented into a plurality sub-pixel regions, a thin film transistor formed in each of the sub-pixel regions, an insulating layer and a planarization layer formed on the thin film transistor, a semitransparent reflective layer selectively formed in each sub-pixel region on the planarization layer, a protective layer formed on the semitransparent reflective layer, an anode electrode formed in a region corresponding to the semitransparent reflective layer on the protective layer and connected to the thin film transistor, an organic light emitting layer connected to the anode electrode, and emitting light, and a cathode electrode formed on the organic light emitting layer.

20 Claims, 6 Drawing Sheets

ORGANIC LIGHT EMITTING DIODE DISPLAY DEVICE AND METHOD OF MANUFACTURING THE SAME

CROSS-REFERENCE TO RELATED APPLICATIONS

This application claims priority to the Korean Patent Application No. 10-2012-0094094 filed on Aug. 28, 2012, the entirety of which is hereby incorporated by reference herein.

BACKGROUND

1. Field of the Invention

The present invention relates to an organic light emitting diode (OLED) display device and a method of manufacturing the same, and more particularly, to an active-matrix OLED (AMOLED) display device and a method of manufacturing the same.

2. Discussion of the Related Art

Recently, as the information age has come and research on flat panel display devices continues to accelerate, OLED display devices posterior to liquid crystal display (LCD) devices are being actively developed as next-generation flat panel display devices.

Since OLED display devices are self-emitting devices, the OLED display devices do not need a backlight unlike LCD devices, and thus can be more lightened and thinned than the LCD devices. Also, the OLED display devices are driven at a low voltage, realize colors close to natural colors, and have high emission efficiency, a wide viewing angle, and a fast response time. Accordingly, the OLED display devices can vividly realize high-quality moving images.

OLED display devices are current driving devices, and use a complicated driving circuit compared to LCD devices. In each of a plurality of sub-pixels defined by intersection between a plurality of gate lines and data lines, a gate signal transferred through a gate line is applied to a gate electrode of a switching thin film transistor, and a data signal transferred through a data line is applied to a driving thin film transistor by the gate electrode. The data signal applied to a gate electrode of the driving thin film transistor allows a driving current transferred through a power source line to be applied to an anode electrode of a corresponding sub-pixel, thereby driving an organic light emitting layer.

As described above, each sub-pixel of an OLED display device includes a switching thin film transistor and a driving thin film transistor, namely, fundamentally needs two or more thin film transistors. Also, each sub-pixel includes a complicated compensation circuit, for emitting desired color light during a desired time.

The aperture ratio of OLED display devices is considerably lowered by the thin film transistors and the compensation circuit, and thus the intensity of light emitted to the outside is reduced, and light extraction efficiency decreases.

Moreover, light emitted from an OLED of an OLED display device passes through a plurality of thin films, and is finally transferred to the outside through a polarizer. The polarizer is applied to OLED display devices, for preventing the reflection of external light. The emitted light is totally reflected by the thin films and thus lost, or at least 50% of the emitted light is lost while the emitted light passes through the polarizer. For this reason, luminance and light extraction efficiency are reduced.

SUMMARY

Accordingly, the present invention is directed to an OLED display device and a method of manufacturing the same that substantially obviate one or more problems due to limitations and disadvantages of the related art.

An aspect of the present invention is directed to provide an OLED display device with enhanced light extraction efficiency and a method of manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an OLED display device including: a substrate segmented into a plurality sub-pixel regions; a thin film transistor formed in each of the sub-pixel regions; an insulating layer and a planarization layer formed on the thin film transistor; a semitransparent reflective layer selectively formed in each sub-pixel region on the planarization layer, and including a transparent layer and a semitransparent metal layer; a protective layer formed on the semitransparent reflective layer; an anode electrode formed in a region corresponding to the semitransparent reflective layer on the protective layer, and connected to the thin film transistor; an organic light emitting layer connected to the anode electrode, and emitting light; and a cathode electrode formed on the organic light emitting layer.

In another aspect of the present invention, there is provided a method of manufacturing an OLED display device including: forming a thin film transistor in each of a plurality of sub-pixel regions on a substrate; selectively forming a semitransparent reflective layer in each sub-pixel region on the thin film transistor; forming a protective layer on the semitransparent reflective layer; patterning the protective layer to expose the thin film transistor; and forming an anode electrode on the patterned protective layer, the anode electrode being formed as at least one conductive material layer.

In another aspect of the present invention, there is provided a method of manufacturing an OLED display device including: forming a thin film transistor in each of first to third sub-pixel regions on a substrate; forming an insulating layer on the thin film transistor; selectively forming a semitransparent reflective layer in each sub-pixel region on the insulating layer; forming a protective layer on the semitransparent reflective layer; selectively forming a first conductive material layer in each sub-pixel region on the protective layer; and forming a second conductive material layer on the first conductive material layer and the protective layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
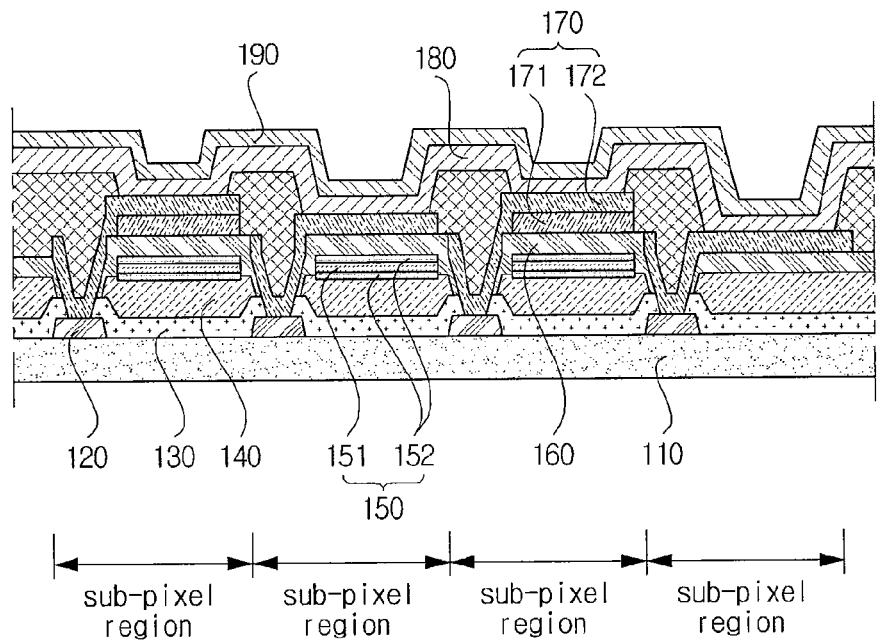
FIG. 1 is a sectional view illustrating an OLED display device according to an embodiment of the present invention.

FIG. 1 is a sectional view illustrating an OLED display device according to an embodiment of the present invention.

As illustrated in FIG. 1, the OLED display device according to an embodiment of the present invention includes a substrate 110, a thin film transistor 120, an insulating layer 130, a planarization layer 140, a semitransparent reflective layer 150, a protective layer 160, an anode electrode 170, an organic light emitting layer 180, and a cathode electrode 190.

The substrate 10 may be formed of glass, a transparent flexible material, or an opaque insulating material. The transparent flexible material may be polyimide, polyetherimide (PEI), polyethyeleneterepthalate (PET) or the like. In a bottom emission type in which light is transferred through the substrate 110, the substrate 110 is required to be transparent. However, in a top emission type in which light is transferred to outside the cathode electrode 190, the substrate 110 is not necessarily required to be transparent, and may be formed of various materials.

Figure 2:
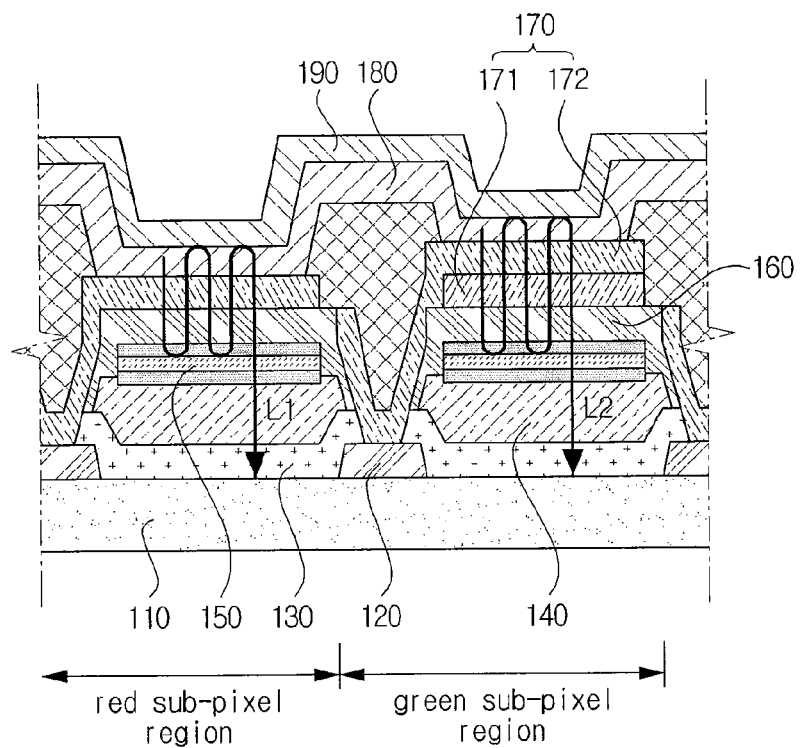
FIG. 2 is a sectional view illustrating a resonance structure according to an embodiment of the present invention.

The thin film transistor 120 is formed on the substrate 110. The thin film transistor 120 of FIG. 2 is a driving thin film transistor connected to the anode electrode 170.

In order for the organic light emitting layer 180 to emit light with image information of a data signal that is inputted according to a scan signal, a switching thin film transistor (not shown) and a driving thin film transistor (not shown) are necessary.

In the switching thin film transistor, when a scan signal is applied to a gate electrode (not shown) extended from a gate line (not shown), a source electrode (not shown) extended from a data line (not shown) receives a data signal, which is transferred to a gate electrode (not shown) of the driving thin film transistor.

In the driving thin film transistor, a current transferred through a power source line (not shown) is applied to the anode electrode 170 through a drain electrode (not shown) with the transferred data signal from the switching thin film transistor, and the emission of the organic light emitting layer 180 in a corresponding pixel is controlled with the current.

Each of a plurality of pixels includes a compensation circuit for preventing abnormal driving that is caused by the delay and/or phase change of various electrical signals, and the compensation circuit may include an additional thin film transistor. Also, the compensation circuit may include a storage capacitor for holding the emission of the organic light emitting layer 180 for a time lasting from a previous frame to a next frame.

The insulating layer 130 is formed on the thin film transistor 120. Also, the insulating layer 130 is formed on a metal line including a gate line, a data line, and a compensation circuit that are necessary for driving the organic light emitting layer 180 as well as the thin film transistor 120. The insulating layer 130 protects the thin film transistor 120 and the metal line from various chemical materials in performing a process, and performs an insulating function inside a device. The insulating layer 130 may be formed of silicon nitride (SiNx).

The planarization layer 140 is formed on the insulating layer 130. The thin film transistor 120 and the metal line are formed under the insulating layer 130, and thus a surface of the insulating layer 130 is not flat. Therefore, the planarization layer 140 planarization a surface in order to stably form the semitransparent reflective layer 150 and the organic light emitting layer 180 (which are formed on the planarization layer 140) and an upper stacking structure. The planarization layer 140 may be formed of all acryl-based materials including photo acryl (PAC) or all materials that form a flat film.

The semitransparent reflective layer 150 is formed in a region corresponding to a region in which the organic light emitting layer 180 on the planarization layer 140 emits light. The semitransparent reflective layer 150 includes a semitransparent metal layer 151. The semitransparent metal layer 151 may be formed of an alloy including silver (Ag). However, metal such as Ag has low adhesive strength to a material (for example, SiNx) that forms the planarization layer 140 and the protective layer 160, and thus in order to prevent the semitransparent metal layer 151 from being partially detaching from the planarization layer 140 and the protective layer 160, adhesive strength can be enhanced by additionally forming a transparent layer 152 (having high adhesive strength) in a region in which the semitransparent metal layer 151 contacts the planarization layer 140 and the protective layer 160. Therefore, the semitransparent reflective layer 150 may include the semitransparent metal layer 151 and the transparent layer 152. The transparent layer 152 may be formed of a transparent material having high adhesive strength to the semitransparent metal layer 151, the planarization layer 140, and the protective layer 160. Accordingly, the transparent layer 152 may be formed of transparent conductive oxide such as indium tin oxide (ITO), indium zinc oxide (IZO), or indium tin zinc oxide (ITZO). Alternatively, the transparent layer 152 may be formed of a material including zinc oxide or tin oxide that is conductive oxide having transparency higher than transparent conductive oxide. Also, the transparent layer 152 is not required to be formed of a conductor in which electricity flows, and thus may be formed of a material that is transparent and has high adhesive strength and low conductivity.

The semitransparent metal layer 151 transfers a portion of light emitted from the organic light emitting layer 180 or a portion of light reflected by the cathode electrode 190 to the outside, and reflects another portion of light in the direction of the cathode electrode 190. In this case, when a distance between the semitransparent reflective layer 150 and the cathode electrode 190 is an integer multiple of the half-wave length of light emitted from a corresponding pixel, light is amplified through constructive interference. When such a reflection operation is repeated, the degree of light amplification increases continuously, and thus external extraction efficiency of light emitted from the organic light emitting layer 180 can be enhanced.

The semitransparent reflective layer 150 is separated from the cathode electrode 190 by a distance corresponding to an integer multiple of the half-wave length of corresponding light, and thus may be formed in only a sub-pixel that emits light having color other than white. Therefore, in a WRGB type in which four sub-pixels (white (W), red (R), green (G), and blue (B) sub-pixels) comprises one pixel, the semitransparent reflective layer 150 is not formed in the white sub-pixel. White light includes an entire wavelength range of visible light, and thus when the semitransparent reflective layer 150 is formed in the white sub-pixel, specific color light having wavelength in which a distance between the semitransparent reflective layer 150 and the cathode electrode 190 satisfies an integer multiple of half-wave length is more amplified than other color light. Accordingly, white light is not emitted, and may be distorted into amplified color light and emitted.

The positioning of the semitransparent reflective layer 150 may be changed according to the OLED display device having the bottom emission type or the top emission type. In the bottom emission type, as described above, the semitransparent reflective layer 150 may be disposed under the anode electrode 170 or on the same plane as that of the anode electrode 170. In the top emission type, the semitransparent reflective layer 150 may be disposed on the same plane as that of the cathode electrode 190 or on the cathode electrode 190.

The protective layer 160 is formed on the semitransparent reflective layer 150. The protective layer 160 may be formed of SiNx, and may be formed of a transparent insulating material. The protective layer 160 is formed on the semitransparent reflective layer 150, and insulates the semitransparent reflective layer 150 from the anode electrode 170. Also, the protective layer 160 may be formed to completely cover the semitransparent reflective layer 150 and completely surrounded by the protective layer 160 and the planarization layer 140, and thus can prevent the damage of the transparent layer 152 (which is formed of the same material as that of the anode electrode 170) in etching the anode electrode 170 later.

The anode electrode 170 is formed in a region corresponding to the semitransparent reflective layer 150 on the protective layer 160. The anode electrode 170 is formed of a transparent conductive material, and may be generally formed of transparent conductive oxide such as ITO, IZO, or ITZO having a high work function. Alternatively, the anode electrode 170 may be formed of a material including zinc oxide or tin oxide that is conductive oxide having a work function lower than ITO.

The anode electrode 170 is electrically connected to the organic light emitting layer 180 formed in each pixel, and supplies a hole to the organic light emitting layer 180. When an electron supplied from the cathode electrode 190 is combined with the hole supplied from the anode electrode 170 and thus the organic light emitting layer 180 emits light, light is transferred in upper and lower directions of the anode electrode 170, and a light transfer direction is changed according to the position of a reflector (not shown). In the bottom emission type, light is required to be transferred in a lower direction of the anode electrode 170, and thus the cathode electrode 190 may be used as the reflector. In the top emission type, light is required to be transferred in an upper direction of the anode electrode 170, and thus the reflector is formed inside the anode electrode 170 or the substrate 110 itself is formed of opaque metal, whereby light may be reflected in an upper direction thereof, namely, in the cathode electrode 190 direction. Alternatively, the reflector is formed between the substrate 110 and the anode electrode 170, and thus light may be transferred to the outside through the transparent cathode electrode 190.

The anode electrode 170 may directly contact the organic light emitting layer 180, or may be electrically connected to the organic light emitting layer 180 with a conductive material therebetween. The anode electrode 170 needs to have a high work function as described above. When a work function that denotes a difference between an internal energy level and an external energy level is high, the number of internal electrons transferred to the outside is reduced. Accordingly, in a material having a high work function, the degree of hole supply is high, and thus the material normally acts as the anode electrode 170.

The anode electrodes 170 of different pixels may have different thicknesses. This is because wavelengths of lights emitted from different pixels differ, and thus it is required to adjust a distance, in which waves resonate by wavelength of emitted light, for realizing resonance. When a value corresponding to the least common multiple of half-wave lengths of emitted lights is set as a resonance distance, at least one of emitted lights is repeatedly reflected between the semitransparent reflective layer 150 and the cathode electrode 190 without being transferred to the outside and thus resonance occurs, and the amplitude of emitted light in which the resonance occurs becomes higher through constructive interference, thus enhancing the extraction efficiency of light transferred to the outside.

The organic light emitting layer 180 is formed on the anode electrode 170. The organic light emitting layer 180 is electrically connected to the anode electrode 170, receives a hole from the anode electrode 170, receives an electron from the cathode electrode 190, and emits light having specific wavelength by the recombination of the hole and electron.

In an RGB type, the organic light emitting layers 180 of different sub-pixels are separated from each other, and formed of different organic materials, which emit lights having different wavelengths in respective sub-pixels. In the WRGB type, the organic light emitting layer 180 is formed by mixing organic materials that emit red light, green light, and blue light, or formed by randomly stacking the organic materials that emit red light, green light, and blue light, in which case white light is emitted from the organic light emitting layer 180 and then lights having different colors are emitted from respective sub-pixels through red, green, and blue color refiners (not shown).

In the WRGB type, when the bottom emission type is used, the white light is transferred in a lower direction of the organic light emitting layer 180, and thus the white light passes through a color refiner (not shown) formed under the organic light emitting layer 180 and thus is transferred to the outside as one of emitted lights including red, green, and blue. When the top emission type is used, the white light is transferred in an upper direction of the organic light emitting layer 180, and thus the white light passes through a color refiner (not shown) formed on the organic light emitting layer 180 and thus is transferred to the outside as one of emitted lights including red, green, and blue. The color of emitted light is not limited thereto, and the emitted light may have one of white, cyan, light blue, dark blue, orange, and yellow. Also, in a pixel that emits white light, the organic light emitting layer 180 emits white light, and thus a separate color refiner may not be provided.

As described above, since lights emitted from respective organic light emitting layers 180 of different pixels have different wavelengths, a resonance distance is set to be suitable for the wavelength of each emitted light in the resonance structure. The resonance distance is determined with the thickness of the anode electrode 170. By stacking a different number of thin films in respective sub-pixels or differently setting the degree of etching for each sub-pixel, the thickness of the anode electrode 170 may be adjusted to be suitable for light emitted from each pixel.

The cathode electrode 190 is formed on the organic light emitting layer 180. The same voltage is applied to the cathode electrodes 190 of all pixels, and thus the cathode electrode 190 may be a kind of common electrode. Therefore, the cathode electrode 190 may be formed as a single layer that covers the entirety of the substrate 110, without patterning. Also, a resistance can be reduced by connecting an auxiliary electrode to a top or bottom of the cathode electrode 190, for preventing the drawback of driving due to the increase in a resistance.

The cathode electrode 190 may be formed of Ag, Al, and Mo having high electrical conductivity and a low work function, or an alloy of Ag and Mg, or an alloy thereof. Also, in the top emission type, light emitted from the organic light emitting layer 180 needs to pass through the cathode electrode 190, and thus the cathode electrode 190 may be formed to a thickness of several hundreds Å or less.

The cathode electrode 190 is electrically connected to the organic light emitting layer 180 formed in each pixel, and supplies an electron to the organic light emitting layer 180. When the electron supplied to the cathode electrode 190 is combined with a hole supplied from the anode electrode 170 and thus light is emitted from the organic light emitting layer 180, light is transferred to upper and lower the anode electrode 170. In the bottom emission type, the cathode electrode 190 is formed of opaque metal and acts as a reflector, or a reflector (not shown) is separately formed in correspondence with the organic light emitting layer 180, in a region opposite to a light transfer direction. In the top emission type, light is required to be transferred in an upper direction of the cathode electrode 190, and thus the cathode electrode 190 may be formed of a conductive material having light transmissivity, and a reflector may be formed inside the anode electrode 170 or on the substrate 110, in which case the substrate 110 itself is formed of opaque metal and thus emitted light is induced to be transferred in the cathode electrode 190 direction.

FIG. 2 is a sectional view illustrating a resonance structure according to an embodiment of the present invention.

As illustrated in FIG. 2, the resonance structure according to an embodiment of the present invention includes the organic light emitting layer 180, the anode electrode 170, the cathode electrode 190, and the semitransparent reflective layer 150.

Resonance can enhance light extraction efficiency with a resonance effect using repetitive reflection of light (which is emitted from the organic light emitting layer 180) between the semitransparent reflective layer 150 and the cathode electrode 190.

The OLED display device includes a plurality of pixels that emit different color lights. Each of the pixels generally includes three sub-pixels that emit three color lights of red, green, and blue, and may further include a plurality of sub-pixels that respectively emit white, cyan, light blue, dark blue, orange, and yellow lights.

Each of color lights such as red light, green light, and blue light has a specific peak wavelength range, which is represented as the wavelength of specific color light. FIG. 2 exemplarily illustrates the resonances of red and green lights respectively emitted from a red sub-pixel and a green sub-pixel, but is not limited thereto. Various color lights having specific peak wavelength may resonate in the principle of FIG. 2. Hereinafter, a red sub-pixel and a green sub-pixel that are formed in the WRGB type will be described as an example.

In the red sub-pixel, white light L1 emitted from the organic light emitting layer 180 passes through a red color refiner (not shown) and is thereby changed to red light L1, which is reflected to the semitransparent metal layer 151 of the semitransparent reflective layer 150. Also, the amplitude of the red light L1 increases through constructive interference by repeatedly performing an operation in which the red light L1 is again reflected by the cathode electrode 190. A portion of the red light L1 having the increased amplitude is again reflected to the cathode electrode 190, and another portion of the red light L1 is transferred to the outside through the semitransparent reflective layer 150.

The resonance of red light L1 has been described above, in the bottom emission type. There is a difference between the bottom emission type and the top emission type in that a direction in which the red light L1 is transferred to the outside is the cathode electrode 190 direction in the top emission type.

In red visible light, a wavelength range is about 610 nm to about 700 nm, and thus in a condition in which the intermediate value of a peak wavelength is about 655 nm, resonance occurs when a distance from the semitransparent reflective layer 150 to the cathode electrode 190 becomes an integer multiple of about 327.5 nm corresponding to half of 655 nm.

In the green sub-pixel, white light L2 emitted from the organic light emitting layer 180 passes through a green color refiner (not shown) and is thereby changed to green light L2, which is reflected to the semitransparent metal layer 151 of the semitransparent reflective layer 150. Also, the amplitude of the green light L2 increases through constructive interference by repeatedly performing an operation in which the green light L2 is again reflected by the cathode electrode 190. A portion of the green light L2 having the increased amplitude is again reflected to the cathode electrode 190, and another portion of the green light L2 is transferred to the outside through the semitransparent reflective layer 150.

The resonance of green light has been described above, in the bottom emission type. There is a difference between the bottom emission type and the top emission type in that a direction in which the green light is transferred to the outside is the cathode electrode 190 direction in the top emission type.

In green visible light, a wavelength range is about 500 nm to about 570 nm, and thus in a condition in which the intermediate value of a peak wavelength is about 535 nm, resonance occurs when a distance from the semitransparent reflective layer 150 to the cathode electrode 190 becomes an integer multiple of about 267.5 nm corresponding to half of 535 nm.

In blue visible light, a wavelength range is about 450 nm to about 500 nm, and thus in a condition in which the intermediate value of a peak wavelength is about 475 nm, resonance occurs when a distance from the semitransparent reflective layer 150 to the cathode electrode 190 becomes an integer multiple of about 237.5 nm corresponding to half of 475 nm.

FIGS. 3A to 3G are sectional views illustrating a method of manufacturing an OLED display device according to an embodiment of the present invention.

Figure 3A:
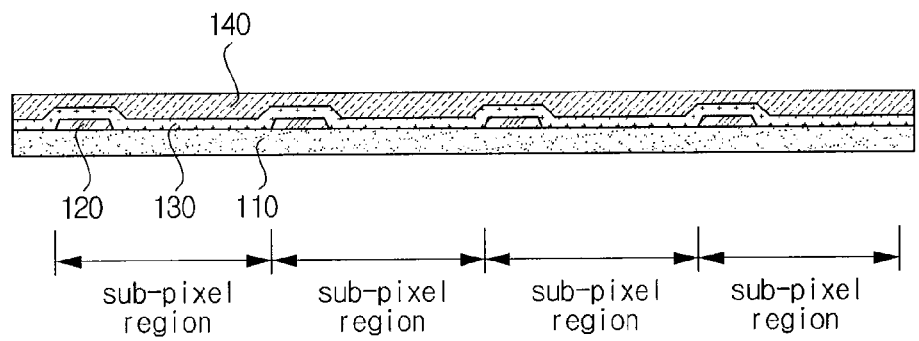
FIGS. 3A to 3G are sectional views illustrating a method of manufacturing an OLED display device according to an embodiment of the present invention.

As illustrated in FIG. 3A, the thin film transistor 120 including a gate electrode (not shown) is formed on the substrate 110. A metal layer of the thin film transistor 120 may be formed of one of the group consisting of M0, Cr, and Ti, and formed by one of a sputtering process and an evaporation process.

Subsequently, the insulating layer 130 is formed by depositing SiNx on the thin film transistor 120. The insulating layer 130 may be formed of a transparent insulating material as well as SiNx, and formed by a plasma enhanced chemical vapor deposition (PECVD) process.

Subsequently, the planarization layer 140 is formed by depositing PAC on the insulating layer 130. The planarization layer 140 has a function of planarizing the unevenness of a lower structure, and therefore needs to have very excellent film uniformity.

Figure 3B:
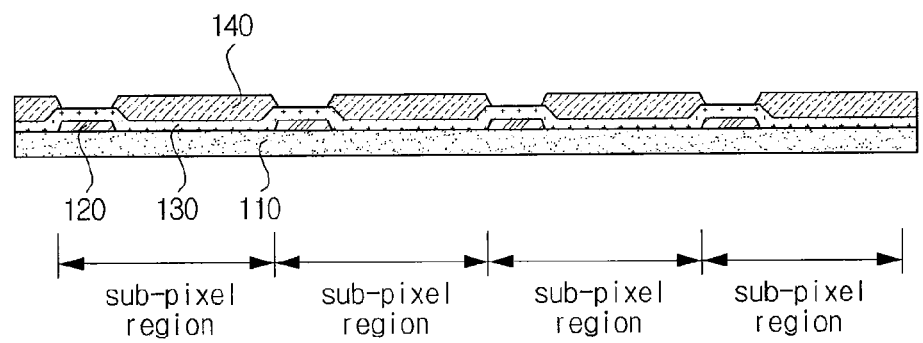

Subsequently, as illustrated in FIG. 3B, the insulating layer 130 corresponding to the thin film transistor 120 formed in each sub-pixel is exposed by patterning the planarization layer 140.

Figure 3C:
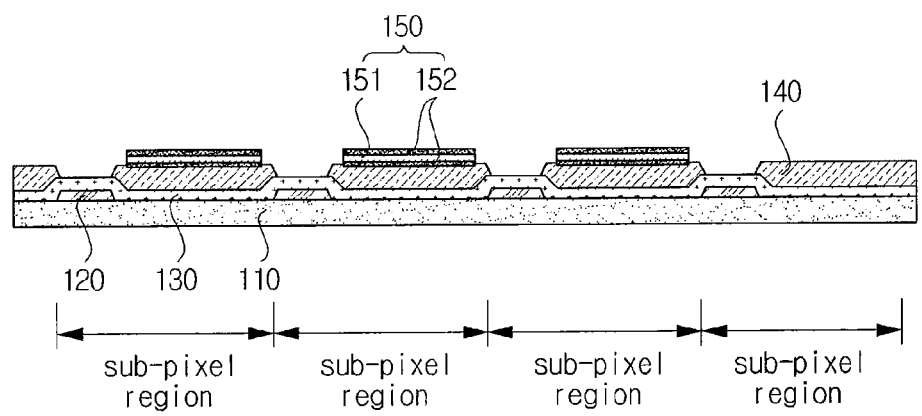

Subsequently, as illustrated in FIG. 3C, the semitransparent reflective layer 150 is formed on the planarization layer 140. The semitransparent reflective layer 150 includes the semitransparent metal layer 151. Alternatively, the semitransparent reflective layer 150 includes the transparent layer 152 and the semitransparent metal layer 151, and may be formed by alternately stacking the transparent layer 152 and the semitransparent metal layer 151. The semitransparent metal layer 151 may be formed of a metal material such as Ag, Al, or Cr, and formed as a thin film for partially transmitting light and reflecting the other light. The semitransparent metal layer 151 may be formed to a thickness of about several hundreds Å for the optimal reflectivity, but the thickness of the semitransparent metal layer 151 is not limited thereto. The transparent layer 152 may be formed of transparent conductive oxide or a non-conductive transparent material for enhancing adhesive strength to SiNx that is a material of the semitransparent metal layer 151 and a material of the protective layer 160 to be formed later. Therefore, the transparent layer 152 may be formed in a region that enables the semitransparent metal layer 151 to contact SiNx.

The semitransparent reflective layer 150 is formed on the planarization layer 140 and the insulating layer 130 under the substrate 110, and then a region other than a region in which the anode electrode 170 will be formed later (i.e., a region to which light emitted from the organic light emitting layer 180 is transferred) may be removed through patterning. The semitransparent reflective layer 150 is a region for causing the resonance of light emitted from the organic light emitting layer 180 of each sub-pixel, and thus as described above, the semitransparent reflective layer 150 may be formed in only a light emitting region, but is not limited to the above description. The semitransparent reflective layer 150 may be formed to overlap the anode electrode 170 in a region that is completely surrounded by the protective layer 160 and the planarization layer 140.

Moreover, when the OLED display device includes a white sub-pixel, the semitransparent reflective layer 150 may not be formed in the white sub-pixel. This is because white light includes several wavelengths as described above, and thus when the white light is repeatedly reflected by the semitransparent reflective layer 150 and thus resonance occurs, color is distorted. However, the semitransparent reflective layer 150 or a similar structure having reflectivity lower than that of the semitransparent reflective layer 150 may be formed within a range in which the color of the white light is not distorted, but is not limited to the above description.

Figure 3D:
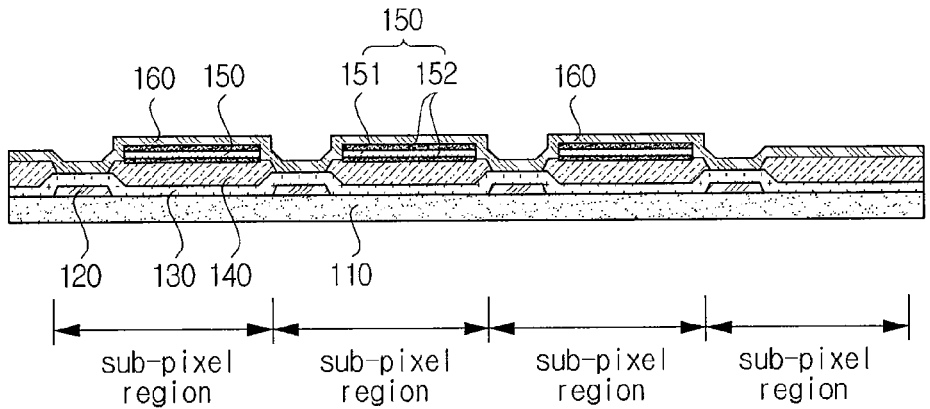

Subsequently, as illustrated in FIG. 3D, the protective layer 160 is formed on the semitransparent reflective layer 150, the planarization layer 140 exposed through the semitransparent reflective layer 150, and the insulating layer 130 that is exposed by patterning the planarization layer 140. The protective layer 160 may be formed of SiNx or a transparent material similar to SiNx. The protective layer 160 separates the semitransparent reflective layer 150 from first and second conductive material layer 171 and 172 that will be formed later.

In a case where the transparent layer 152 is formed of the same material as that of the first and second conductive material layer 171 and 172, when the transparent layer 152 is exposed to the outside, the transparent layer 152 can be damaged in wet-etching the first and second conductive material layers 171 and 172 that are formed later. Accordingly, the protective layer 160 can prevent the transparent layer 152 from being damaged in wet-etching the first and second conductive material layers 171 and 172.

Figure 3E:
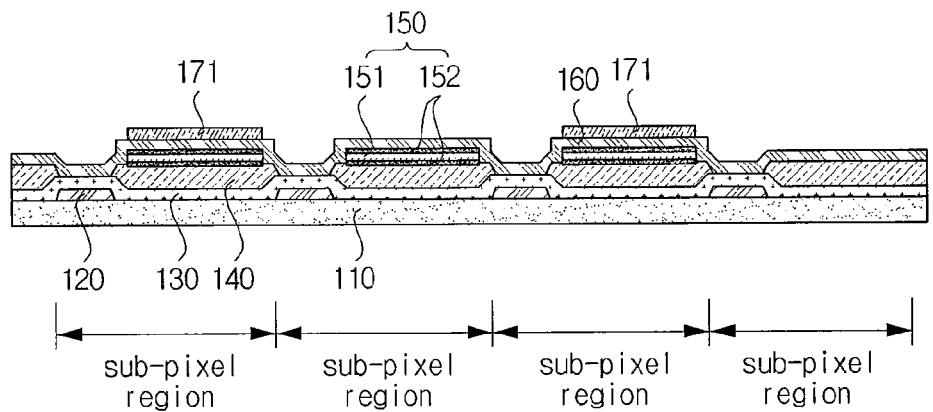

Subsequently, as illustrated in FIG. 3E, the first conductive material layer 171 configuring the anode electrode 170 is selectively formed in each sub-pixel region. The first conductive material layer 171 is a layer that is inserted for adjusting a resonance distance to an integer multiple of half-wave length of light emitted from a corresponding sub-pixel. Therefore, the first conductive material layer 171 is formed in a region corresponding to the semitransparent reflective layer 150, and may be formed by stacking a conductive material layer at least one time for adjusting a distance. However, the number of stacks is not limited.

The first conductive material layer 171 may be formed of transparent conductive oxide such as ITO, IZO, or ITZO. Alternatively, the anode electrode 170 may be formed of a material including zinc oxide or tin oxide that is conductive oxide having a work function lower than ITO.

To describe ITO as an example, ITO is first deposited on the protective layer 160 and exposed, and then, after wet-etching ITO with oxialic acid as an etchant, the first conductive material layer 171 may be selectively formed in each sub-pixel.

In FIG. 3, the first conductive material 171 is formed in only two sub-pixels. However, the first conductive material layer 171 may be formed in several cases, for adjusting an integer multiple of half-wave length of light emitted from each sub-pixel.

For example, in a case where red light, green light, and blue light are emitted from respective sub-pixels, when the half-wave length of red light is 10 k, the half-wave length of green light becomes about 8 k, and the half-wave length of blue light becomes about 7 k. In a first scheme that sets a resonance distance, a resonance distance of a sub-pixel emitting red light, a resonance distance of a sub-pixel emitting green light, and a resonance distance of a sub-pixel emitting blue light may be set at a ratio of 10:8:7. That is, resonance distances of respective sub-pixels may be differently set.

In a second scheme that sets a resonance distance, resonance distances of two sub-pixels among three sub-pixels may be identically set. For example, when desiring to identically set a resonance distance of a sub-pixel emitting red light and a resonance distance of a sub-pixel emitting green light, the resonance distances of the two sub-pixels may be identically set to 40 k by applying 40 that is the least common multiple of 10 and 8.

Moreover, when desiring to identically set a resonance distance of a sub-pixel emitting green light and a resonance distance of a sub-pixel emitting blue light, the resonance distances of the two sub-pixels may be identically set to 56 k by applying 56 that is the least common multiple of 8 and 7.

Moreover, when desiring to identically set a resonance distance of a sub-pixel emitting blue light and a resonance distance of a sub-pixel emitting red light, the resonance distances of the two sub-pixels may be identically set to 70 k by applying 70 that is the least common multiple of 7 and 10.

As illustrated in FIG. 3E, when the resonance distances of two sub-pixels are identically set, a photolithography process can be simplified. Also, when 56 k that is the shortest distance among the resonance distances is selected as a resonance distance, the resonance distance is not largely increased, and thus as a light movement path increases, the decrease in light efficiency can be minimized.

When desiring to identically set the resonance distances of the respective sub-pixels emitting the red light, green light, and blue light, a resonance distance may be set to 560 k by applying 560 that is the least common multiple of 10, 8, and 7. When the resonance distance is set to 560 k, a device becomes thicker, and the movement path of emitted light becomes longer, causing the loss of light. For this reason, identically adjusting the resonance distances of two sub-pixels selected from among a plurality of sub-pixels may be an appropriate embodiment that enhances light efficiency and moreover satisfies the advantages of a process.

Figure 3F:
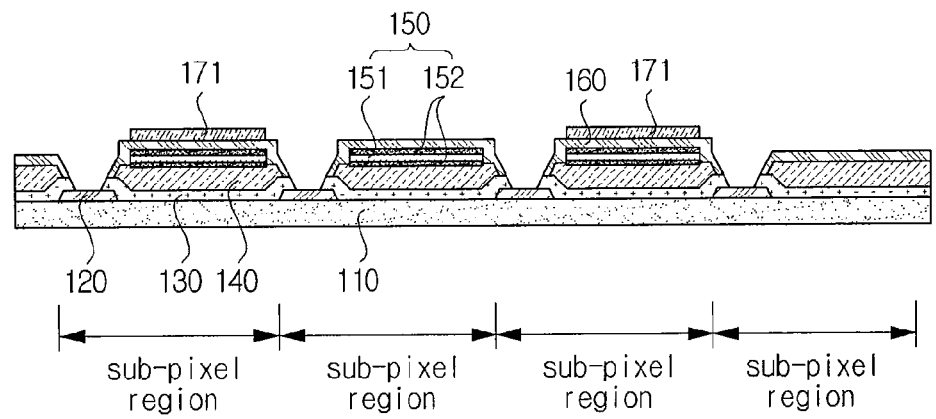

Subsequently, as illustrated in FIG. 3F, the thin film transistor 120 is exposed by patterning the insulating layer 130 and the protective layer 160 (which are formed in a region corresponding to the thin film transistor 120) before forming the second conductive material layer 172. The exposed region of the thin film transistor 120 is a region that is connected to the second conductive material layer 172 later, and more specifically, may be a drain electrode to which a driving current for driving the organic light emitting layer 180 is applied. The insulating layer 130 and the protective layer 160 may be patterned through dry etching.

Figure 3G:
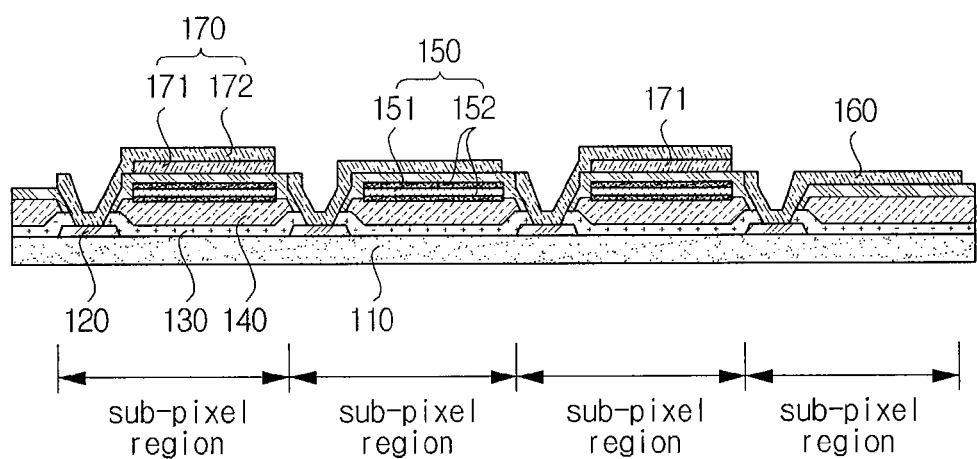

Subsequently, as illustrated in FIG. 3G, the second conductive material layer 172 is formed on the first conductive material layer 171 of a sub-pixel with the first conductive material layer 171 formed therein, and simultaneously, the second conductive material layer 172 is formed on the protective layer 160 of a sub-pixel in which the first conductive material layer 171 is not formed.

The second conductive material layer 172 is formed over a portion of the substrate 110 on the first conductive material layer 171 and the protective layer 160, and then by patterning the second conductive material layer 172 for each sub-pixel through wet etching, the second conductive material layer 172 connected to the thin film transistor 120 of each sub-pixel may be formed.

FIGS. 4A to 4E are sectional views illustrating a method of manufacturing an OLED display device according to another embodiment of the present invention.

Figure 4A:
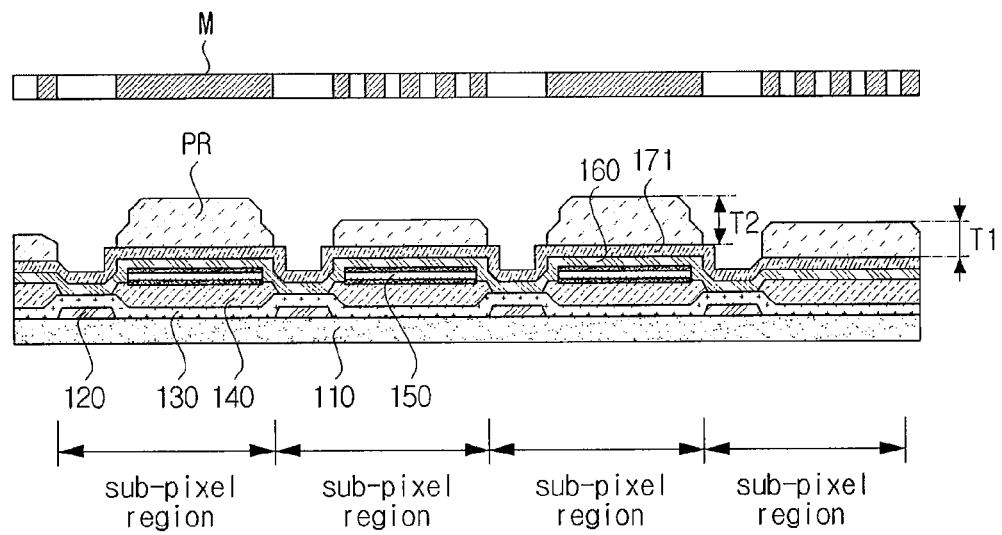
FIGS. 4A to 4E are sectional views illustrating a method of manufacturing an OLED display device according to another embodiment of the present invention.

As illustrated in FIG. 4A, a thin film transistor 120, a protective layer 130, a planarization layer 140, a semitransparent reflective layer 150, a protective layer 160, and a first conductive material layer 171 are sequentially formed on the substrate 110.

Subsequently, a photoresist material is deposited over the substrate 110, and diffraction-exposed with a diffraction exposure mask M. Subsequently, a region corresponding to the thin film transistor 120 and a boundary region of each of a plurality of sub-pixels are completely exposed to light and removed through wet etching. Also, a region (i.e., a region to which light emitted from the organic light emitting layer 180 is transferred) corresponding to the semitransparent reflective layer 150 of each sub-pixel is exposed to light by half, and thus a portion of an upper layer of a photoresist layer PR is removed, thereby forming a photoresist layer PR having a first thickness T1 in some sub-pixel regions. Furthermore, a photoresist layer PR having a second thickness T2 is formed in a sub-pixel region in which light is completely blocked.

The photoresist layer PR having the second thickness T2 is formed in a sub-pixel in which the first conductive material layer 171 will be formed, and the photoresist layer PR having the first thickness T1 is formed in a sub-pixel in which the first conductive material layer 171 is not formed. The sub-pixel with the first conductive material layer 171 formed therein is not limited to FIG. 4A, and a sub-pixel may be selectively formed in various cases.

Figure 4B:
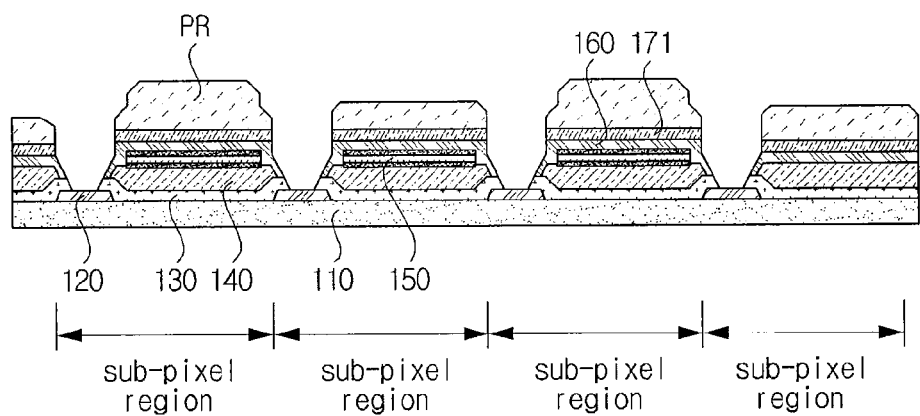

Subsequently, as illustrated in FIG. 4B, the first conductive material layer 171 exposed through the photoresist layer PR is removed through wet etching, with the photoresist layer PR as a mask. Subsequently, the thin film transistor 120 is exposed by dry-etching the protective layer 160 and the insulating layer 130. Subsequently to an operation of etching the first conductive material layer 171, the protective layer 160 and insulating layer 130 exposed through the photoresist layer PR may be removed without performing a separate exposure process, thus decreasing the number of processes and the number of masks.

Figure 4C:
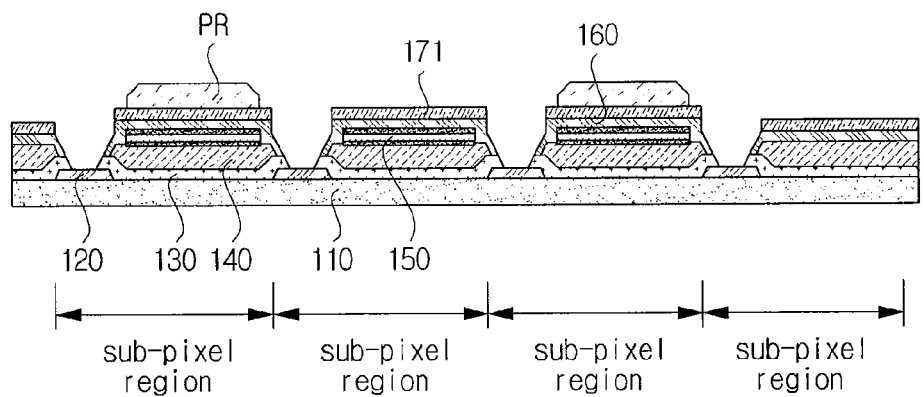

Subsequently, as illustrated in FIG. 4C, by ashing the photoresist layer PR, the photoresist layer PR having the first thickness T1 is removed, and the first conductive material layer 171 formed under the removed photoresist layer PR is exposed. The ashing process removes only a specific portion by combusting the photoresist layer PR unlike in a process that removes a thin film through etching. The first conductive material layers 171 in some sub-pixel regions are additionally exposed through the asching process.

Figure 4D:
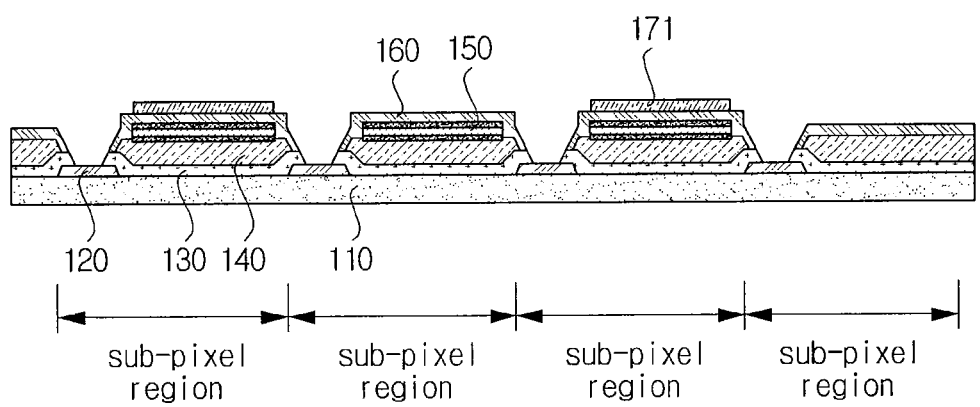

Subsequently, as illustrated in FIG. 4D, the first conductive material layer 171 that has been additionally exposed through the ashing process is removed through wet etching. A sub-pixel region, from which the first conductive material layer 171 has been removed, may be a sub-pixel having a resonance distance that is set shorter than that of the other sub-pixels. Therefore, the first conductive material layer 171 may be selectively formed in each sub-pixel.

Figure 4E:
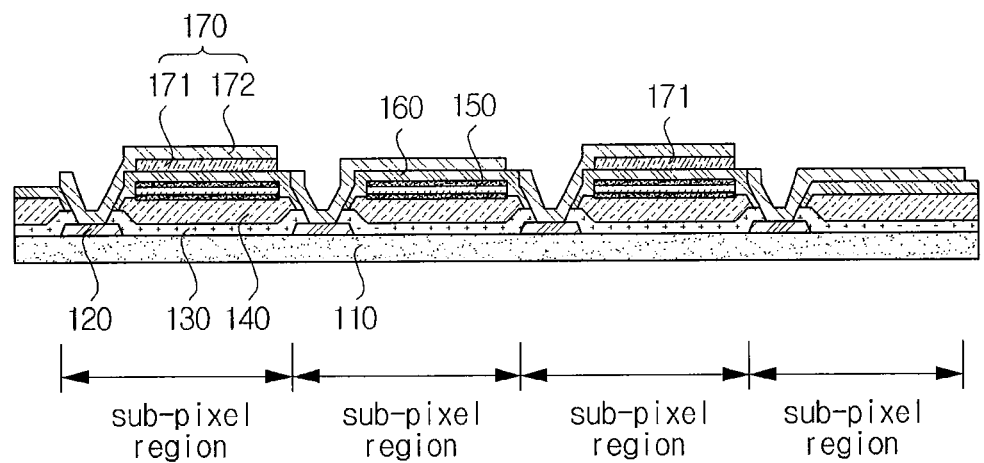

Subsequently, as illustrated in FIG. 4E, a second conductive material layer 172 is formed in each pixel region. The second conductive material layer 172 may be formed on the first conductive material layer 171 depending on each pixel region. In the sub-pixel from which the first conductive material layer 171 has been removed, the second conductive material layer 172 may be formed on the protective layer 160. Also, the second conductive material layer 172 is connected to the exposed thin film transistor 120. Therefore, an anode electrode configured with the first and second conductive material layers 171 and 172 may be formed.

As described above, anode electrodes 170 having different thicknesses are formed by stacking a plurality of conductive material layers, and thus light efficiency can be enhanced through resonance of emitted light.

Moreover, the anode electrodes 170 having different thicknesses are formed through the diffraction exposure process and the process of ashing the photoresist layer PR, thus decreasing the number of processes and the number of masks. Furthermore, the protective layer 160 is formed between the semitransparent reflective layer 150 and the anode electrode 170, thus preventing the semitransparent reflective layer 150 from being damaged in performing a process.

According to the embodiments of the present invention, light extraction efficiency can be enhanced by forming the resonance structure that amplifies light emitted from the organic light emitting layer.

Moreover, according to the embodiments of the present invention, the semitransparent reflective layer and the anode electrode are formed to be separated from each other by the protective layer formed therebetween, and thus can prevent the semitransparent reflective layer to be damaged in a process of etching the anode electrode.

Moreover, according to the embodiments of the present invention, the resonance structure is formed through the diffraction exposure process and the ashing process, thus decreasing the number of masks and the number of processes.

It will be apparent to those skilled in the art that various modifications and variations can be made in the present invention without departing from the spirit or scope of the inventions. Thus it is intended that the present invention covers the modifications and variations of this invention provided they come within the scope of the appended claims and their equivalents.

What is claimed is:

1. An organic light emitting diode (OLED) display device, comprising:
    a substrate segmented into a plurality of sub-pixel regions;
    a thin film transistor formed in each of the sub-pixel regions;
    an insulating layer and a planarization layer formed on the thin film transistor;
    a semitransparent reflective layer selectively formed in each sub-pixel region on the planarization layer, and comprising a transparent layer and a semitransparent metal layer;
    a protective layer formed on the semitransparent reflective layer;
    an anode electrode formed in a region corresponding to the semitransparent reflective layer on the protective layer, and connected to the thin film transistor;
    an organic light emitting layer connected to the anode electrode, and emitting light; and
    a cathode electrode formed on the organic light emitting layer, wherein the semitransparent reflective layer is formed to be interposed between the planarization layer and the organic light emitting layer.

2. The display device of claim 1, wherein the protective layer is configured to be between the anode electrode and the semitransparent reflective layer such that the semitransparent reflective layer is protected during a formation of the anode layer.

3. The display device of claim 1, wherein the semitransparent reflective layer is formed in a region where the organic light emitting layer emits light.

4. The display device of claim 3, wherein the plurality of sub-pixel regions correspond to at least a red, green, blue and a white color, and
    wherein the semitransparent reflective layer is formed in a sub-pixel region corresponding to the red, green and blue colors only.

5. The display device of claim 1, wherein a first semitransparent reflective layer is formed in a first sub-pixel region of a first sub-pixel, and the first semitransparent reflective layer is configured to be within a first distance from the cathode electrode, wherein the first distance corresponds to an integer multiple of a half-wavelength of a color corresponding to the first sub-pixel.

6. The display device of claim 5, wherein a second semitransparent reflective layer is formed in a second sub-pixel region of a second sub-pixel, and the second semitransparent reflective layer is configured to be within a second distance from the cathode electrode, wherein the second distance corresponds to an integer multiple of a half-wavelength of a color corresponding to the second sub-pixel.

7. The display device of claim 6, wherein the first sub-pixel corresponds to a red color, the second sub-pixel corresponds to a green color, and the first distance is different than the second distance.

8. A method of manufacturing an organic light emitting diode (OLED) display device, the method comprising:
    forming a thin film transistor in each of a plurality of sub-pixel regions on a substrate;
    selectively forming a semitransparent reflective layer in each sub-pixel region on the thin film transistor;
    forming a protective layer on the semitransparent reflective layer;
    patterning the protective layer to expose the thin film transistor;
    forming an anode electrode on the patterned protective layer, wherein the anode electrode comprises at least one conductive material layer; and
    forming an organic light emitting layer on the anode electrode.

9. The method of claim 8, wherein the plurality of sub-pixel regions correspond to at least a red, green, blue and a white color, and
    wherein the semitransparent reflective layer is formed in a sub-pixel region corresponding to the red, green and blue colors only.

10. The method of claim 8, wherein forming the protective layer comprises:
    forming the protective layer between the anode electrode and the semitransparent reflective layer in order to protect the semitransparent reflective layer during the formation of the anode electrode.

11. The method of claim 8, wherein forming the anode electrode comprises:
    forming a conductive material layer on the protective layer, and
    forming one or more conductive material layers on the conductive material layer, wherein one of the one or more conductive material layers is formed to be in contact with the thin film transistor.

12. The method of claim 8, wherein forming the anode electrode comprises:
    forming one or more conductive material layers in a first sub-pixel region corresponding to a first color, and
    forming one or more conductive material layers in a second sub-pixel region corresponding to a second color,
    wherein a first thickness of the one or more conductive material layers in the first sub-pixel region is different from a second thickness of the one or more conductive material layers in the second sub-pixel region.

13. The method of claim 12, wherein the first color and second color corresponds to one of a red, green and blue color.

14. A method of manufacturing an organic light emitting diode (OLED) display device, the method comprising:
    forming a thin film transistor in each of a plurality of sub-pixel regions on a substrate;
    forming an insulating layer and a planarization layer on the thin film transistor;
    selectively forming a semitransparent reflective layer in each sub-pixel region on the planarization layer;
    forming a protective layer on the semitransparent reflective layer;
    selectively forming a first conductive material layer on the protective layer;
    selectively forming a photoresist layer on the first conductive material layer, wherein a thickness of the photoresist layer in a corresponding sub-pixel region is dependent on an exposure of the photoresist layer in the corresponding sub-pixel region;
    exposing the first conductive material layer; and
    forming an organic light emitting layer on the exposed first conductive material layer.

15. The method of claim 14, wherein a first thickness of the photoresist layer in a first sub-pixel region corresponding to a first color is different from a second thickness of the photoresist layer in a second sub-pixel region corresponding to a second color.

16. The method of claim 14, further comprising:
etching at least the photoresist layer, first conductive material layer, protective layer, and the insulating layer in order to expose the thin film transistor in each corresponding sub-pixel region.

17. The method of claim 16, further comprising:
forming a second conductive material layer to be interposed between at least the exposed first conductive material layer and the organic light emitting layer so that the second conductive material layer contacting the exposed thin film transistor in each corresponding sub-pixel region.

18. The method of claim 17, wherein the first conductive material layer is exposed via an ashing process.

19. The method of claim 17, further comprising:
exposing the protective layer in a sub-pixel region not having a corresponding photoresist layer, wherein the first conductive material layer is exposed in a sub-pixel region having a corresponding photoresist layer, and
wherein the second conductive material layer is interposed between at least a portion of the exposed first conductive material layer and the organic light emitting layer in the sub-pixel region having the corresponding photoresist layer and is interposed between at least a portion of the exposed protective layer and the organic light emitting layer in the sub-pixel region having not the corresponding photoresist layer so that the second conductive material layer contacting the exposed thin film transistor in each corresponding sub-pixel region.

20. The method of claim 19, wherein the first conductive material layer and the protective layer are exposed via an ashing process.

* * * * *